(12) United States Patent
Rouse

(10) Patent No.: US 10,475,178 B1
(45) Date of Patent: Nov. 12, 2019

(54) SYSTEM, METHOD AND COMPUTER PROGRAM PRODUCT FOR INSPECTING A WAFER USING A FILM THICKNESS MAP GENERATED FOR THE WAFER

(71) Applicant: KLA-Tencor Corporation, Milpitas, CA (US)

(72) Inventor: Gordon Charles Rouse, Dublin, CA (US)

(73) Assignee: KLA-TENCOR CORPORATION, Milpitas, CA (US)

( * ) Notice: Subject to any disclaimer, the term of this patent is extended or adjusted under 35 U.S.C. 154(b) by 42 days.

(21) Appl. No.: 15/419,867

(22) Filed: Jan. 30, 2017

(51) Int. Cl.
*G06T 7/00* (2017.01)
*G01B 11/06* (2006.01)

(52) U.S. Cl.
CPC .............. *G06T 7/001* (2013.01); *G01B 11/06* (2013.01); *G06T 2207/30148* (2013.01)

(58) Field of Classification Search
None
See application file for complete search history.

(56) References Cited

U.S. PATENT DOCUMENTS

| | | | | |
|---|---|---|---|---|
| 5,798,838 | A * | 8/1998 | Taniguchi | G03F 7/70133 355/53 |
| 7,659,975 | B1 * | 2/2010 | Ramani | G01N 21/9501 356/237.4 |
| 8,126,255 | B2 | 2/2012 | Bhaskar et al. | |
| 2009/0034831 | A1 * | 2/2009 | Amanullah | G01N 21/95607 382/145 |
| 2010/0329540 | A1 * | 12/2010 | Bhaskar | G01N 21/93 382/149 |
| 2012/0176612 | A1 * | 7/2012 | Funada | G01N 21/9501 356/237.5 |
| 2012/0229618 | A1 * | 9/2012 | Urano | G01N 21/9501 348/92 |
| 2013/0114081 | A1 * | 5/2013 | Fukazawa | G01N 21/9501 356/369 |
| 2013/0242294 | A1 * | 9/2013 | Taniguchi | G01N 21/956 356/237.5 |
| 2013/0343632 | A1 * | 12/2013 | Urano | G06T 7/001 382/149 |
| 2015/0144769 | A1 * | 5/2015 | Nozawa | G01N 21/8851 250/208.1 |
| 2018/0082415 | A1 * | 3/2018 | Sezginer | G03F 1/84 |

* cited by examiner

*Primary Examiner* — Jiangeng Sun
(74) *Attorney, Agent, or Firm* — Zilka-Kotab, PC

(57) ABSTRACT

A system, method, and computer program product are provided for inspecting a wafer using a film thickness map generated for the wafer. In use, a plurality of locations on a wafer are determined from a design of the wafer. Additionally, a measured brightness at each of the determined locations on the wafer is obtained. Further, a film thickness map for the wafer is generated from the obtained measurements. The wafer is then inspected using the film thickness map.

17 Claims, 7 Drawing Sheets

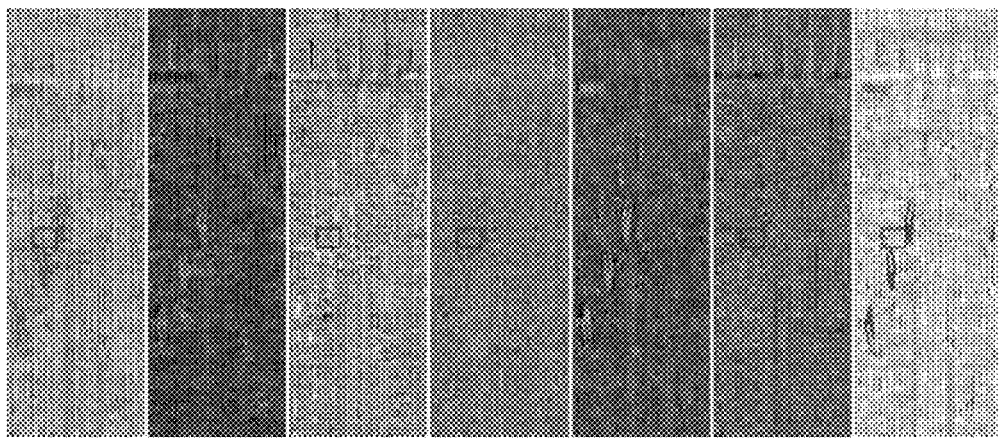
FIGURE 1

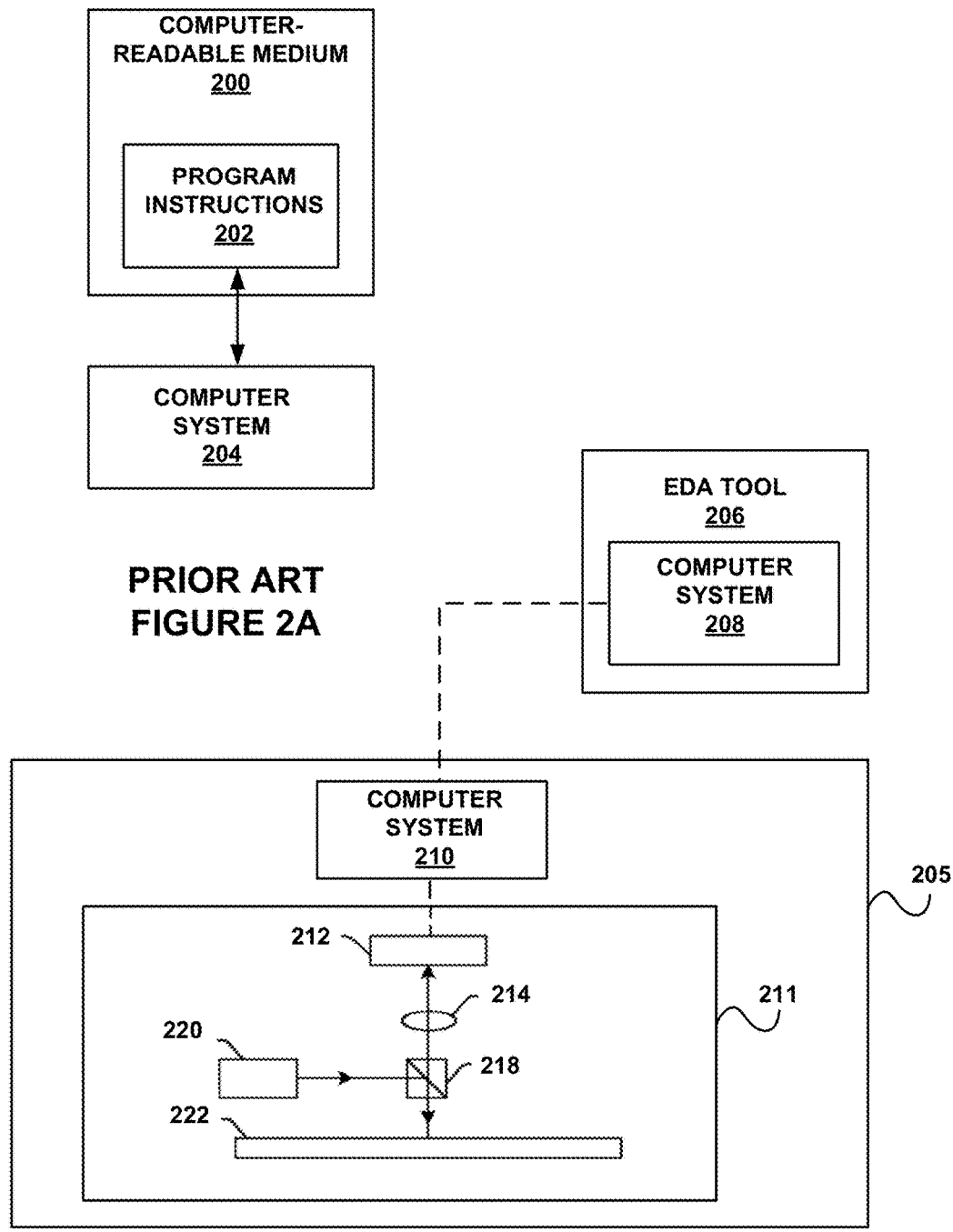
PRIOR ART
FIGURE 2A
PRIOR ART
FIGURE 2B

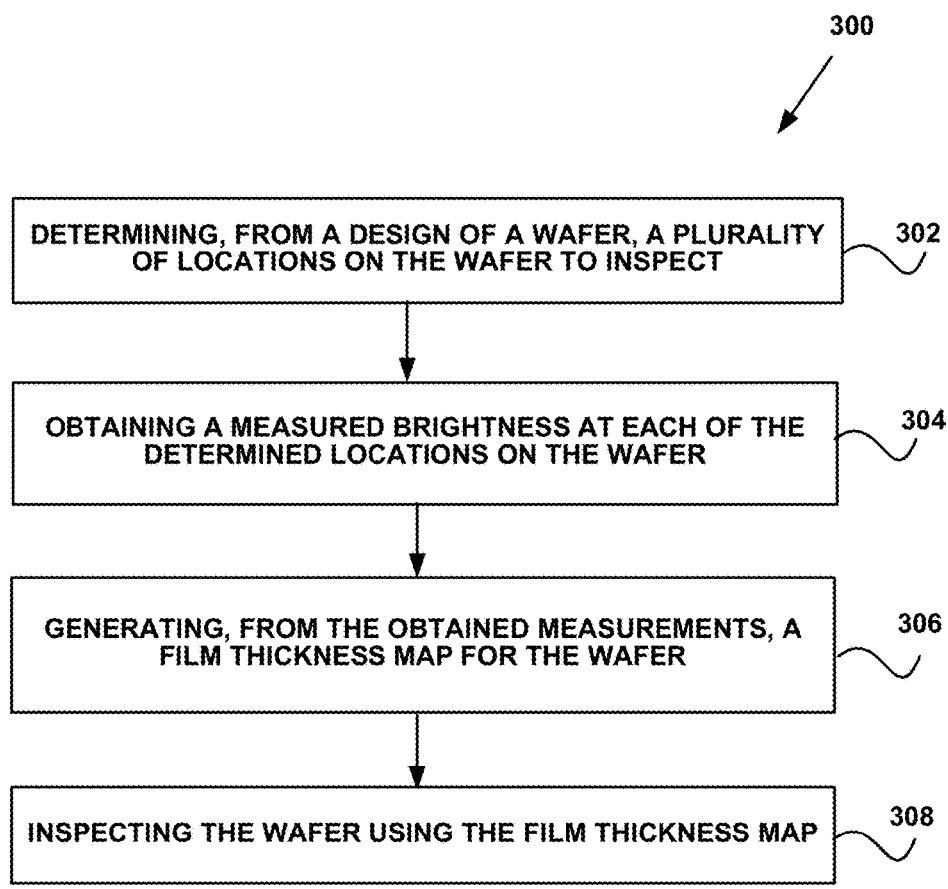
FIGURE 3

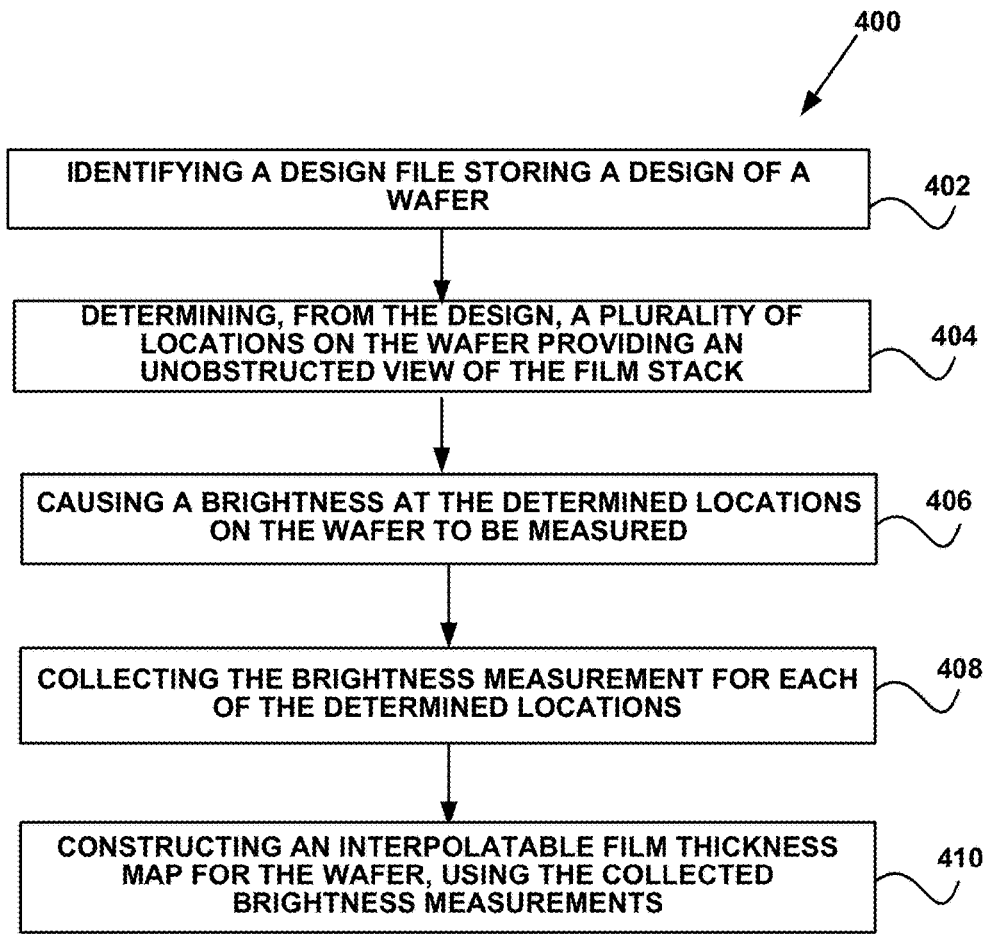
FIGURE 4

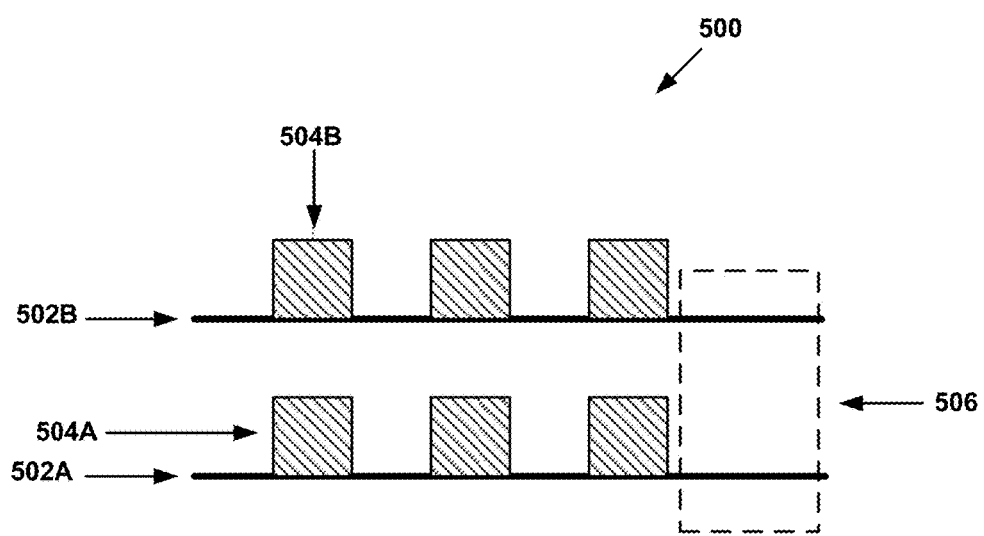
FIGURE 5

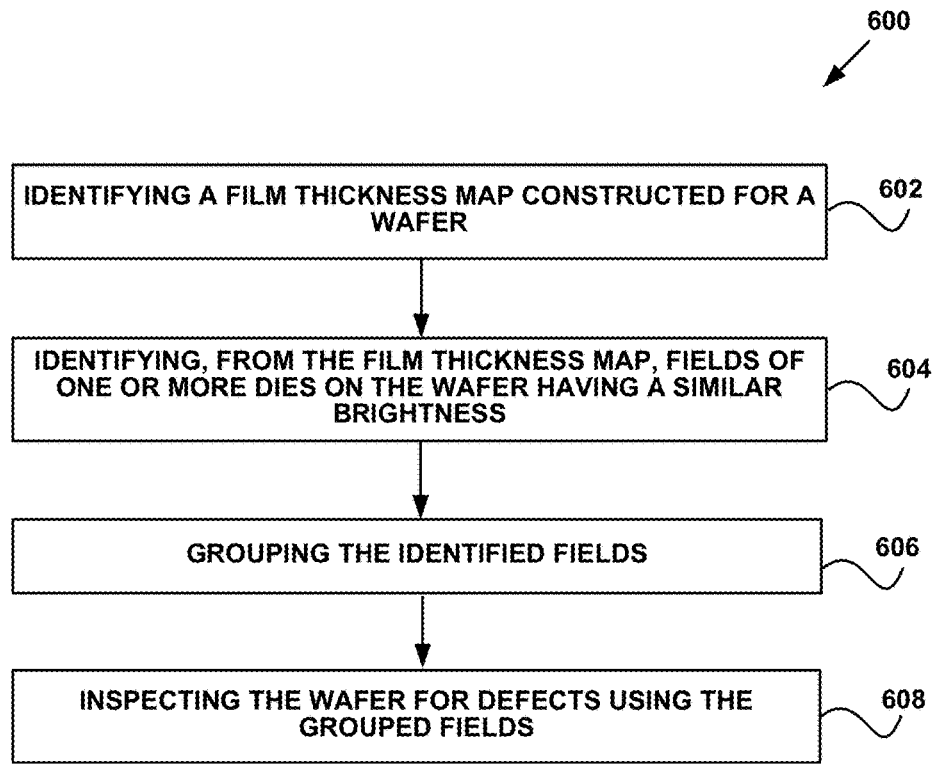
FIGURE 6

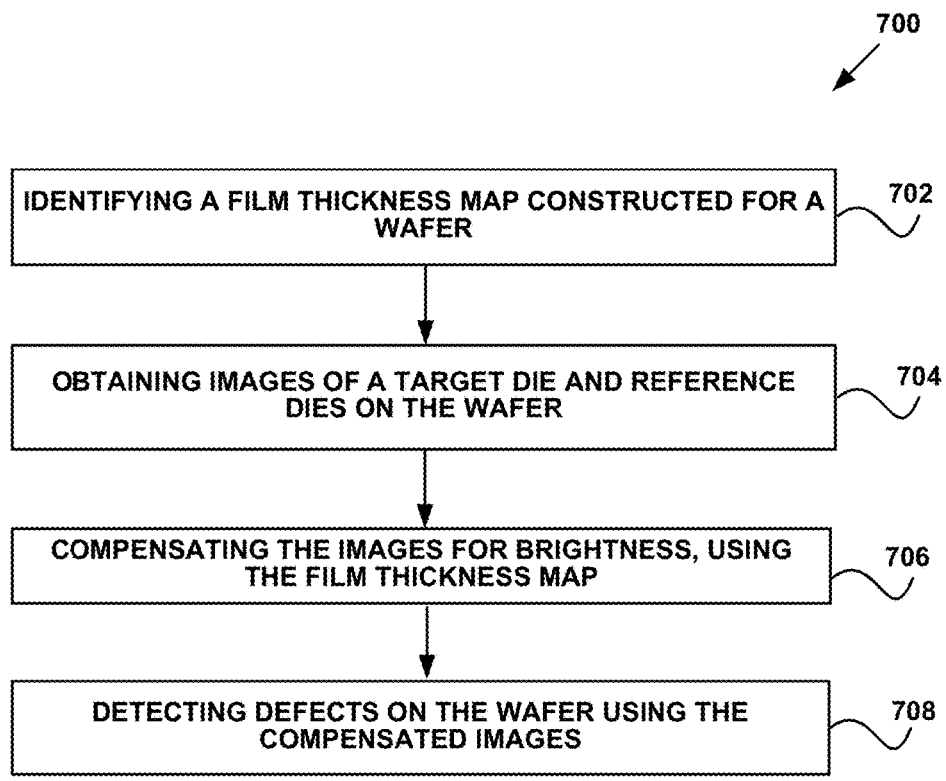
FIGURE 7

SYSTEM, METHOD AND COMPUTER PROGRAM PRODUCT FOR INSPECTING A WAFER USING A FILM THICKNESS MAP GENERATED FOR THE WAFER

FIELD OF THE INVENTION

The present invention relates to wafer inspection, and more particularly to wafer inspection using image processing.

BACKGROUND

In general, wafer inspection involves inspecting a wafer fabricated from a design in order to collect information on the wafer. The collected information is typically in the form of an image, and can include measurements of structural and material characteristics of the wafer (e.g. material composition, dimensional characteristics of structures and/or critical dimensions of structures, etc.). This information can then be processed for various purposes. While there are numerous types of inspection systems that exist to perform the information collection and processing briefly mentioned above, these inspection systems have various limitations.

In particular, inspection systems which utilize light to collect information on the wafer are generally prone to error due to a thin-film effect (i.e. thin-film interference) introduced by multiple layers fabricated on the wafer. This thin-film effect causes different brightness to be observed by the inspection system across other-wise identical portions of the wafer. The collected information (e.g. wafer image) will accordingly indicate this different brightness, and will therefore inaccurately represent the actual wafer. FIG. 1 shows images of a same location across repeating dies on a wafer each having a different brightness.

Furthermore, in some implementations the inspection system processes the collected information to identify likely, or even actual, defects on the wafer. In these inspection system implementations, portions of the wafer intended to be identical (i.e. through the wafer design) are generally compared with one another and differences are determined to be indicative of a potential or actual defect. However, when portions of the wafer intended to be identical appear different due to the thin-film effect, these portions may be falsely identified as having a potential or actual defect.

There is thus a need for addressing these and/or other issues associated with the prior art wafer inspection techniques.

SUMMARY

A system, method, and computer program product are provided for inspecting a wafer using a film thickness map generated for the wafer. In use, a plurality of locations on a wafer are determined from a design of the wafer. Additionally, a measured brightness at each of the determined locations on the wafer is obtained. Further, a film thickness map for the wafer is generated from the obtained measurements. The wafer is then inspected using the film thickness map.

BRIEF DESCRIPTION OF THE DRAWINGS

FIG. 1 shows images of a same location across repeating dies on a wafer each having a different brightness, in accordance with an embodiment.

FIG. 2A shows a block diagram illustrating one embodiment of a non-transitory computer-readable medium that includes program instructions executable on a computer system for performing one or more of the computer-implemented methods described herein.

FIG. 2B is a schematic diagram illustrating a side view of one embodiment of an inspection system configured to detect defects on a fabricated device.

FIG. 3 illustrates a method for inspecting a wafer using a film thickness map generated for the wafer, in accordance with an embodiment.

FIG. 4 illustrates a method for constructing a film thickness map for a wafer, in accordance with another embodiment.

FIG. 5 illustrates a multi-layer portion of a die on a wafer, in accordance with an embodiment.

FIG. 6 illustrates a method for performing wafer field-to-field defect detection using a film thickness map generated for the wafer, in accordance with yet another embodiment.

FIG. 7 illustrates a method for performing wafer die-to-die defect detection using a film thickness map generated for the wafer, in accordance with still yet another embodiment.

DETAILED DESCRIPTION

The following description discloses a system, method, and computer program product for inspecting a wafer using a film thickness map generated for the wafer. It should be noted that this system, method, and computer program product, including the various embodiments described below, may be implemented in the context of any inspection or review system (e.g. wafer inspection, reticle inspection, laser scanning inspection systems, Defect scanning electron microscope (SEM) review, etc.), such as the one described below with reference to FIG. 2B.

An additional embodiment relates to a non-transitory computer-readable medium storing program instructions executable on a computer system for inspecting a wafer using a film thickness map generated for the wafer. One such embodiment is shown in FIG. 2A. In particular, as shown in FIG. 2A, computer-readable medium 200 includes program instructions 202 executable on computer system 204. The computer-implemented method includes the steps of the method described below with reference to FIG. 3. The computer-implemented method for which the program instructions are executable may include any other operations described herein (e.g. with respect to the methods of FIGS. 4, 5 and/or 6).

Program instructions 202 implementing methods such as those described herein may be stored on computer-readable medium 200. The computer-readable medium may be a storage medium such as a magnetic or optical disk, or a magnetic tape or any other suitable non-transitory computer-readable medium known in the art. As an option, computer-readable medium 200 may be located within computer system 204.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), or other technologies or methodologies, as desired.

The computer system 204 may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer system 204 may also include any suitable processor known in the art such as a parallel processor. In addition, the computer system 204 may include a computer platform with high speed processing and software, either as a standalone or a networked tool.

An additional embodiment relates to a system configured for inspecting a wafer using a film thickness map generated for the wafer. One embodiment of such a system is shown in FIG. 2B. The system includes inspection system 305 configured to generate output for a component fabricated on a wafer. The system also includes one or more computer systems configured for performing the operations described below with reference to FIG. 3, etc. The one or more computer systems may be configured to perform these operations according to any of the embodiments described herein. The computer system(s) and the system may be configured to perform any other operations described herein and may be further configured as described herein.

In the embodiment shown in FIG. 2B, one of the computer systems is part of an electronic automation design (EAD) tool, and the inspection system and another of the computer systems are not part of the EAD tool. These computer system may include, for example, the computer system 204 described above with reference to FIG. 2A. For example, as shown in FIG. 2B, one of the computer systems may be computer system 208 included in EAD tool 206. The EAD tool 206 and the computer system 208 included in such a tool may include any commercially available EAD tool.

The inspection system 205 may be configured to generate the output for the component fabricated on a wafer by scanning the wafer with light and detecting light from the wafer during the scanning. For example, as shown in FIG. 2B, the inspection system 205 includes light source 220, which may include any suitable light source known in the art. Light from the light source may be directed to beam splitter 218, which may be configured to direct the light from the light source to wafer 222. The light source 220 may be coupled to any other suitable elements (not shown) such as one or more condensing lenses, collimating lenses, relay lenses, objective lenses, apertures, spectral filters, polarizing components and the like. As shown in FIG. 2B, the light may be directed to the wafer 222 at a normal angle of incidence. However, the light may be directed to the wafer 222 at any suitable angle of incidence including near normal and oblique incidence. In addition, the light or multiple light beams may be directed to the wafer 222 at more than one angle of incidence sequentially or simultaneously. The inspection system 205 may be configured to scan the light over the wafer 222 in any suitable manner.

Light from wafer 222 may be collected and detected by one or more channels of the inspection system 205 during scanning. For example, light reflected from wafer 222 at angles relatively close to normal (i.e., specularly reflected light when the incidence is normal) may pass through beam splitter 218 to lens 214. Lens 214 may include a refractive optical element as shown in FIG. 2B. In addition, lens 214 may include one or more refractive optical elements and/or one or more reflective optical elements. Light collected by lens 214 may be focused to detector 212. Detector 212 may include any suitable detector known in the art such as a charge coupled device (CCD) or another type of imaging detector. Detector 212 is configured to generate output that is responsive to the reflected light collected by lens 214. Therefore, lens 214 and detector 212 form one channel of the inspection system 205. This channel of the inspection system 205 may include any other suitable optical components (not shown) known in the art.

Since the inspection system shown in FIG. 2B is configured to detect light specularly reflected from the wafer 222, the inspection system 205 is configured as a BF inspection system. Such an inspection system 205 may, however, also be configured for other types of wafer inspection. For example, the inspection system shown in FIG. 2B may also include one or more other channels (not shown). The other channel(s) may include any of the optical components described herein such as a lens and a detector, configured as a scattered light channel. The lens and the detector may be further configured as described herein. In this manner, the inspection system 205 may also be configured for DF inspection.

The inspection system 205 may also include a computer system 210 that is configured to perform one or more steps of the methods described herein. For example, the optical elements described above may form optical subsystem 211 of inspection subsystem 205, which may also include computer system 210 that is coupled to the optical subsystem 211. In this manner, output generated by the detector(s) during scanning may be provided to computer system 210. For example, the computer system 210 may be coupled to detector 212 (e.g., by one or more transmission media shown by the dashed line in FIG. 2B, which may include any suitable transmission media known in the art) such that the computer system 210 may receive the output generated by the detector.

The computer system 210 of the inspection system 205 may be configured to perform any operations described herein. For example, computer system 210 may be configured for automatically generating a wafer image to design mapping as described herein. In addition, computer system 210 may be configured to perform any other steps described herein. Furthermore, although some of the operations described herein may be performed by different computer systems, all of the operations of the method may be performed by a single computer system such as that of the inspection system 205 or a standalone computer system. In addition, the one or more of the computer system(s) may be configured as a virtual inspector such as that described in U.S. Pat. No. 8,126,255 issued on Feb. 28, 2012 to Bhaskar et al., which is incorporated by reference as if fully set forth herein.

The computer system 210 of the inspection system 205 may also be coupled to another computer system that is not part of the inspection system such as computer system 208, which may be included in another tool such as the EAD tool 206 described above such that computer system 210 can receive output generated by computer system 208, which may include a design generated by that computer system 208. For example, the two computer systems may be effectively coupled by a shared computer-readable storage medium such as a fab database or may be coupled by a transmission medium (e.g. network, etc.) such as that described above such that information may be transmitted between the two computer systems.

It is noted that FIG. 2B is provided herein to generally illustrate a configuration of an inspection system that may be included in the system embodiments described herein. Obviously, the inspection system configuration described herein may be altered to optimize the performance of the inspection system as is normally performed when designing a commercial inspection system. In addition, the systems described herein may be implemented using an existing inspection system (e.g., by adding functionality described herein to an existing inspection system) such as the 39xx/29xx/28xx series of tools that are commercially available from KLA-Tencor. For some such systems, the methods described herein may be provided as optional functionality of the system (e.g., in addition to other functionality of the system). Alternatively, the system described herein may be designed "from scratch" to provide a completely new system.

FIG. 3 illustrates a method 300 for inspecting a wafer using a film thickness map generated for the wafer, in accordance with an embodiment. The method 300 may be carried out in the context of the environments described above with reference to FIGS. 2A and/or 2B. For example, the method 300 may be carried out by a computer processor of an inspection system, such as a computer processor of any of the computer systems described above in FIGS. 2A and/or 2B. Further, the aforementioned definitions may equally apply to the present description.

As shown in operation 302, a plurality of locations on a wafer are determined from a design of the wafer. In an embodiment, the design of the wafer may be stored in computer memory. With respect to this embodiment, the design may be received by being retrieved from the computer memory.

In the context of the present description, the wafer refers to a device fabricated of semiconductor material and having a plurality of dies situated thereon, as is well known in the art of semiconductor technology. The wafer may have modulated or non-modulated dies. The dies may be, at least in part, repeating dies (i.e. have a same design). The design of the wafer may accordingly define specifications (e.g. measurements, etc.) for the various features (e.g. dies) of the wafer, including film layers and the location of structures situated thereon. In any case, the design is capable of being used to fabricate the wafer.

As noted above, locations on the wafer are determined from the design of the wafer. The locations may be determined automatically (e.g. by the computer processor) based on predefined criteria. For example, the locations may be a same location on a plurality of the repeating dies of the wafer. As another example, the locations may be of a predetermined size (e.g. user configured area). As yet another example, the locations on the wafer may each provide an unobstructed view of a film stack of the wafer by the inspection system (e.g. layers of the film without intervening structures situated thereon that would obstruct a view by the inspection system of any of the layers of film), or alternatively the locations may at least each have a same multi-layer structure.

Additionally, as shown in operation 304, a measured brightness at each of the determined locations on the wafer is obtained. For example, the computer processor may cause the inspection system to measure the brightness at each of the determined locations on the wafer. In one embodiment, the computer processor may cause the inspection system (e.g. a metrology tool of the inspection system) to scan the locations on the wafer with light and measure a resulting brightness of the light detected from the wafer during the scanning, and then the computer processor may obtain the measured brightness at each of the locations.

Further, as shown in operation 306, a film thickness map for the wafer is generated from the obtained measurements. The film thickness map may indicate the measured brightness at each of the locations on the wafer determined in operation 302. In addition, the film thickness map may be interpolatable, or the measured brightness at each of the locations may be interpolated to fit a continuous curve in order to calculate brightness for other locations (e.g. all other locations) on the wafer. Where the interpolation is performed, the film thickness map may also indicate the calculated brightness for the other locations on the wafer.

The wafer is then inspected using the film thickness map, as shown in operation 308. In one embodiment, inspecting the wafer using the film thickness map may include performing defect detection on the wafer using the film thickness map. This defect detection may be performed using the inspection system described above.

In one embodiment, the defect detection may be field-to-field detection in which like fields (across a single die or multiple die of the wafer) are compared to identify differences therebetween, with any differences being identified as potential or actual defects. The like fields may be determined from the film thickness map. For example, the field-to-field detection may identify, from the film thickness map, fields of one or more dies on the wafer having a similar (within a predefined threshold) brightness. The field-to-field detection may then group the identified fields, and further inspect the wafer for defects using the grouped fields. In particular, the images of the grouped fields may be compared, as mentioned above.

In another embodiment, the defect detection may be die-to-die detection in which target and references dies (that are repeating dies) are compared to identify differences therebetween, with any differences being identified as potential or actual defects. In particular, locations across the repeating dies with a like pattern can be compared to identify the differences therebetween. The like pattern can be determined from the design of the wafer. Once the like pattern is determined, images of the dies, or particularly the locations having that pattern, can be compensated for any varying brightness using the film thickness map. After the compensation, defects may be detected using the compensated images.

It should be noted that while the wafer inspection of operation 308 is described in terms of examples involving defect detection, the wafer inspection may be any type of inspection for any purpose. However, the inspection utilizes the film thickness map so that any brightness variation not intended by the design (i.e. due to a thin-film effect) is taken into account (e.g. compensated for) during the inspection. This provides for an inspection process that can provide more accurate inspection results.

FIG. 4 illustrates a method 400 for constructing a film thickness map for a wafer, in accordance with another embodiment. The method 400 may be carried out in the context of the environments described above with reference to FIGS. 2A and/or 2B. For example, the method 400 may be carried out by a computer processor of any of the computer systems described above in FIGS. 2A and/or 2B. Further, the aforementioned definitions may equally apply to the present description.

As shown in operation 402, a design file storing a design of a wafer is identified. A plurality of locations on the wafer providing an unobstructed view of the film stack are then determined from the design, as shown in operation 404. For example, FIG. 5 illustrates a multi-layer portion of a die on a wafer 500, with stacked film layers 502A-502B and structures 504A-B situated on those film layers 502A-502B. In this example, the area designated by 506 which does not have any structures 504A-B situated on the film layers 502A-502B may be where the inspection system could obtain an unobstructed view of the film stack.

In operation 406, a brightness at each of the determined locations on the wafer is caused to be measured. For example, the computer processor may cause a metrology tool of the inspection system to measure the brightness at each of the determined locations on the wafer. The brightness measurement is then collected for each of the determined locations, as shown in operation 408. For example, the computer processor may collect the brightness measurements from the metrology tool.

Further, as shown in operation 410, an interpolatable film thickness map for the wafer is constructed, using the collected brightness measurements. The interpolatable film thickness map may store a mapping of each of the determined locations on the wafer to the brightness measurement collected for that determined location. Moreover, in the present embodiment the film thickness map is capable of being interpolated to automatically calculate brightness measurements for the remaining locations on the wafer.

FIG. 6 illustrates a method 600 for performing wafer field-to-field defect detection using a film thickness map generated for the wafer, in accordance with yet another embodiment. The method 400 may be carried out in the context of the environments described above with reference to FIGS. 2A and/or 2B. For example, the method 400 may be carried out by a computer processor of any of the computer systems described above in FIGS. 2A and/or 2B. Further, the aforementioned definitions may equally apply to the present description.

As shown in operation 602, a film thickness map constructed for a wafer is identified. For example, the film thickness map may be that constructed in accordance with the method 400 described above in FIG. 4. Further, the film thickness map may be identified from computer memory storing the film thickness map.

In operation 604, fields of one or more dies on the wafer having similar brightness are identified from the film thickness map. In one embodiment, the field-to-field defect detection may be an intra-die detection process, in which case the identified fields may be located on a single die of the wafer. In another embodiment, the field-to-field defect detection may be performed across repeating dies of the wafer, in which case the identified fields may be located across the repeating dies of the wafer. In a further embodiment, the fields may be determined to have a similar brightness when the brightness measurements for the fields (as determined from the film thickness map) are within a predefined range of one another. In still yet another embodiment, fields with the most brightness may be grouped.

Still yet, in operation 606, the identified fields are grouped. The wafer is then inspected for defects using the grouped fields, as shown in operation 608. This defect detection may include comparing collected images of the grouped fields to one another. In this way, by performing the defect detection on fields with a like brightness, the detection of false defects otherwise resulting from brightness discrepancies may be avoided.

FIG. 7 illustrates a method 700 for performing wafer die-to-die defect detection using a film thickness map generated for the wafer, in accordance with still yet another embodiment. The method 400 may be carried out in the context of the environments described above with reference to FIGS. 2A and/or 2B. For example, the method 400 may be carried out by a computer processor of any of the computer systems described above in FIGS. 2A and/or 2B. Further, the aforementioned definitions may equally apply to the present description, for example, where the film thickness map is constructed in accordance with the method 400 described above in FIG. 4.

As shown in operation 702, a film thickness map constructed for a wafer is identified. For example, the film thickness map may be that constructed in accordance with the method 400 described above in FIG. 4. Further, the film thickness map may be identified from computer memory storing the film thickness map.

In operation 704, images of target and reference dies on the wafer are obtained. The target die may be a die of the wafer on which defects are intended to be detected. The reference dies may be two dies situated on the wafer adjacent or otherwise near the target die, such that the target and reference dies may be repeating dies.

The images are then compensated for brightness using the film thickness map, as shown in operation 706. Thus, the images may be adjusted based on the film thickness map to remove or reduce variations in brightness in like locations across the target and reference dies.

Further, in operation 708, defects on the wafer are detected using the compensated images. For example, the compensated images may be aligned and compared, where any differences may indicate defects on the wafer. This defect detection process may be any that is well known in the art, such as a double difference detection process where a difference image between the target die image and each reference die image is obtained, and then the two difference images are compared with similarities indicating defects on the target die. In any case, by performing the defect detection on the compensated images, the detection of false defects otherwise resulting from brightness discrepancies may be avoided.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
   determining, by a computer processor from a design of a wafer, a plurality of locations on the wafer;
   obtaining, by the computer processor, a measured brightness at each of the determined locations on the wafer;
   generating, by the computer processor from the obtained measurements, a film thickness map for the wafer by
      storing a mapping of each of the determined locations on the wafer to a corresponding measured brightness obtained for the determined location,
      interpolating the measured brightness at each of the determined locations to calculate brightness for additional locations on the wafer not included in the determined locations, and
      storing a mapping of each of the additional locations on the wafer to the calculated brightness for the additional location;
   inspecting, by the computer processor, the wafer using the film thickness map.

2. The method of claim 1, further comprising retrieving the design of the wafer from computer memory storing the design.

3. The method of claim 1, wherein the locations on the wafer each provide an unobstructed view of a film stack of the wafer.

4. The method of claim 1, wherein the locations on the wafer each have a same multi-layer structure.

5. The method of claim 1, wherein the locations on the wafer are of a predetermined area.

6. The method of claim 1, wherein the wafer has repeating dies.

7. The method of claim 6, wherein the locations are a same area on a plurality of the repeating dies of the wafer.

8. The method of claim 1, wherein the computer processor is a component of an inspection system.

9. The method of claim 8, further comprising causing, by the computer processor, the inspection system to measure the brightness at each of the determined locations on the wafer.

10. The method of claim 1, wherein the inspecting the wafer using the film thickness map includes performing defect detection on the wafer using the film thickness map.

11. The method of claim 10, wherein the defect detection is field-to-field detection which:
   identifies, from the film thickness map, fields of one or more dies on the wafer each having a brightness within a predefined range,
   groups the identified fields, and
   compares collected images of the grouped fields to one another to detect defects.

12. A non-transitory computer readable medium storing computer code executable by a computer processor to perform a method comprising:
   determining, by a computer processor from a design of a wafer, a plurality of locations on the wafer;
   obtaining, by the computer processor, a measured brightness at each of the determined locations on the wafer;
   generating, by the computer processor from the obtained measurements, a film thickness map for the wafer by
      storing a mapping of each of the determined locations on the wafer to a corresponding measured brightness obtained for the determined location,
      interpolating the measured brightness at each of the determined locations to calculate brightness for additional locations on the wafer not included in the determined locations, and
      storing a mapping of each of the additional locations on the wafer to the calculated brightness for the additional location;
   inspecting, by the computer processor, the wafer using the film thickness map.

13. An inspection system, comprising:
   a memory and a processor for:
      determining, from a design of a wafer, a plurality of locations on the wafer;
      obtaining a measured brightness at each of the determined locations on the wafer;
      generating, from the obtained measurements, a film thickness map for the wafer by
         storing a mapping of each of the determined locations on the wafer to a corresponding measured brightness obtained for the determined location,
         interpolating the measured brightness at each of the determined locations to calculate brightness for additional locations on the wafer not included in the determined locations, and
         storing a mapping of each of the additional locations on the wafer to the calculated brightness for the additional location;
      inspecting the wafer using the film thickness map.

14. The inspection system of claim 13, wherein the locations on the wafer each provide an unobstructed view of a film stack of the wafer.

15. The inspection system of claim 13, wherein the locations on the wafer each have a same multi-layer structure.

16. The inspection system of claim 13, wherein the locations are a same area on a plurality of repeating dies of the wafer.

17. The inspection system of claim 13, wherein the inspecting the wafer using the film thickness map includes performing defect detection on the wafer using the film thickness map.

* * * * *